United States Patent
Na

(10) Patent No.: US 12,527,170 B2
(45) Date of Patent: Jan. 13, 2026

(54) DISPLAY DEVICE AND METHOD OF MANUFACTURING THE SAME

(71) Applicant: SAMSUNG DISPLAY CO., LTD., Yongin-si (KR)

(72) Inventor: Yeseul Na, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/413,189

(22) Filed: Jan. 16, 2024

(65) Prior Publication Data

US 2024/0155866 A1     May 9, 2024

Related U.S. Application Data

(62) Division of application No. 17/403,080, filed on Aug. 16, 2021, now Pat. No. 11,910,639.

(30) Foreign Application Priority Data

Oct. 15, 2020   (KR) ........................ 10-2020-0133732

(51) Int. Cl.
  *H01L 51/52*   (2006.01)
  *H10K 59/122*  (2023.01)
  (Continued)

(52) U.S. Cl.
  CPC ......... *H10K 59/124* (2023.02); *H10K 59/122* (2023.02); *H10K 59/8052* (2023.02);
  (Continued)

(58) Field of Classification Search
  CPC ............... H10K 59/124; H10K 59/122; H10K 59/8052; H10K 59/88; H10K 59/876; H10K 50/852; H10K 71/00
  (Continued)

(56) References Cited

U.S. PATENT DOCUMENTS 7,598,671 B2   10/2009   Song et al.
8,212,269 B2    7/2012   Karg et al.
(Continued)

FOREIGN PATENT DOCUMENTS

KR   1020070008215 A   1/2007
KR     100968191 B1   7/2010
(Continued)

OTHER PUBLICATIONS

Resonance phenomenon in oled panel <https://news.samsungdisplay.com/15264/?s> Jul. 2018, Please See English Translation of the Relevant Portion.

*Primary Examiner* — Dzung Tran
(74) *Attorney, Agent, or Firm* — CANTOR COLBURN LLP

(57) ABSTRACT

A display device includes a first pixel electrode, a bank layer defining a first opening exposing at least a portion of the first pixel electrode, a first intermediate layer arranged on the first pixel electrode in the first opening and which emits light including light of a first wavelength, an opposite electrode arranged on the first intermediate layer and including a first region overlapping the first intermediate layer in a plan view, and an upper substrate arranged on the opposite electrode. An optical distance D1 between the first region and the upper substrate satisfies the equation below:

D1=A+($\lambda$1)/2×n, where A denotes the minimum optical distance between the first region and the upper substrate at a point where light of $\lambda$1 has a maximum intensity, n is an integer equal to or greater than 0, and $\lambda$1 denotes the first wavelength.

10 Claims, 17 Drawing Sheets

(51) Int. Cl.
*H10K 59/124* (2023.01)
*H10K 59/80* (2023.01)
*H10K 59/88* (2023.01)
*G09G 3/3233* (2016.01)
*H10K 59/12* (2023.01)

(52) U.S. Cl.
CPC .......... *H10K 59/876* (2023.02); *H10K 59/88* (2023.02); *G09G 3/3233* (2013.01); *G09G 2300/0809* (2013.01); *H10K 59/1201* (2023.02)

(58) Field of Classification Search
USPC .......................................................... 257/40
See application file for complete search history.

(56) References Cited

U.S. PATENT DOCUMENTS

| | | | |
|---|---|---|---|
| 8,253,127 | B2 | 8/2012 | Kang et al. |
| 8,384,102 | B2 | 2/2013 | Michellys |
| 9,570,710 | B2 | 2/2017 | Oh et al. |
| 9,853,093 | B2 | 12/2017 | Shim et al. |
| 9,921,346 | B2 | 3/2018 | Shin et al. |
| 10,325,960 | B2 | 6/2019 | Song et al. |
| 2004/0245531 | A1* | 12/2004 | Fuii .................. G09G 3/3225 257/88 |
| 2005/0082534 | A1* | 4/2005 | Kim .................. H10K 59/123 257/72 |
| 2008/0169757 | A1 | 7/2008 | Chang et al. |
| 2009/0142983 | A1 | 6/2009 | Song et al. |
| 2010/0007271 | A1* | 1/2010 | Lee .................. H10K 59/122 438/42 |
| 2011/0317429 | A1 | 12/2011 | Aiba et al. |
| 2012/0188215 | A1 | 7/2012 | Bushankuchu |
| 2013/0099258 | A1 | 4/2013 | Lim et al. |
| 2014/0054556 | A1 | 2/2014 | Park et al. |
| 2014/0295597 | A1 | 10/2014 | Sato et al. |
| 2015/0137090 | A1 | 5/2015 | Lee et al. |
| 2016/0087018 | A1 | 3/2016 | Shim et al. |
| 2017/0025641 | A1 | 1/2017 | Zhang et al. |
| 2019/0189701 | A1 | 6/2019 | Bang et al. |
| 2021/0296414 | A1* | 9/2021 | Cui .................. H10K 59/131 |

FOREIGN PATENT DOCUMENTS

| | | |
|---|---|---|
| KR | 101604806 B1 | 3/2016 |
| KR | 1020160032338 A | 3/2016 |
| KR | 1020160034458 A | 3/2016 |
| KR | 1020170049782 A | 5/2017 |
| KR | 1020190072824 A | 6/2019 |
| KR | 102067159 B1 | 1/2020 |

\* cited by examiner

DISPLAY DEVICE AND METHOD OF MANUFACTURING THE SAME

This application is a divisional of U.S. patent application Ser. No. 17/403,080, filed on Aug. 16, 2021, which claims priority to Korean Patent Application No. 10-2020-0133732, filed on Oct. 15, 2020, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

An organic light-emitting display device can be driven at a low voltage, is thin and lightweight, and has wide viewing angles, excellent contrast, and fast response speeds, and thus has attracted attention as a next-generation display device.

The organic light-emitting display device has a wide light-emission wavelength, and thus has a reduced light-emission efficiency and reduced color purity. In addition, since light emitted from an organic emission layer has no specific directivity, a considerable number of photons emitted in an arbitrary direction do not reach an actual observer due to total internal reflection of an organic light-emitting device, thereby degrading the light extraction efficiency of the organic light-emitting element. Accordingly, a method of increasing light extraction efficiency by forming a resonance structure by controlling a thickness of the organic emission layer is used. However, by only using the resonance structure, there is a limit to increasing light extraction efficiency of an organic light-emitting display device that includes an organic emission layer formed using a printing method.

SUMMARY

One or more embodiments include a display device having an improved light extraction efficiency and a method of manufacturing the display device.

Additional aspects will be set forth in part in the description which follows and, in part, will be apparent from the description, or may be learned by practice of the presented embodiments of the disclosure.

According to one or more embodiments, a display device includes a substrate, a pixel circuit layer arranged on the substrate and including at least one thin-film transistor, a via-insulating layer arranged on the pixel circuit layer, a first pixel electrode arranged on the via-insulating layer, a bank layer arranged on the via-insulating layer and defining a first opening exposing at least a portion of the first pixel electrode, a first intermediate layer arranged on the first pixel electrode in the first opening and which emits light including light of a first wavelength, an opposite electrode arranged on the first intermediate layer and including a first region overlapping the first intermediate layer in a plan view, and an upper substrate arranged on the opposite electrode, wherein an optical distance D1 between the first region and the upper substrate satisfies the equation below:

$D1 = A + (\lambda 1)/2 \times n$, where A denotes the minimum optical distance between the first region and the upper substrate at a point where light of $\lambda 1$ has a maximum intensity, n is an integer equal to or greater than 0, and $\lambda 1$ denotes the first wavelength.

The display device may further include a second pixel electrode and a third pixel electrode arranged on the via-insulating layer, and a second intermediate layer arranged on the second pixel electrode and which emits light including light of a second wavelength and a third intermediate layer arranged on the third pixel electrode and which emits light including light of a third wavelength, where the bank layer defines a second opening and a third opening exposing a portion of the second pixel electrode and a portion of the third pixel electrode, respectively, and the opposite electrode includes a second region and a third region overlapping the second intermediate layer and the third intermediate layer, respectively, in the plan view.

An optical distance D2 between the second region and the upper substrate and an optical distance D3 between the third region and the upper substrate in a thickness direction may satisfy the equations below, respectively:

$D2 = B + (\lambda 2)/2 \times n2$ $D3 = C + (\lambda 3)/2 \times n3$

Here, B is the minimum optical distance between the second region and the upper substrate at a point where light of $\lambda 2$ has a maximum intensity, C is the minimum optical distance between the third region and the upper substrate at a point where light of $\lambda 3$ has a maximum intensity, n2 and n3 are integers equal to or greater than 0, and $\lambda 2$ and $\lambda 3$ denote the second wavelength and the third wavelength, respectively.

The lights of the first wavelength, the light of the second wavelength, and the light of the third wavelength may include red light, green light, and blue light, respectively The first intermediate layer, the second intermediate layer, and the third intermediate layer may have different thicknesses from each other.

Regions of the via-insulating layer that overlap the first pixel electrode, the second pixel electrode, and the third pixel electrode, respectively, may have different thicknesses from each other Portions of an upper surface of the via-insulating layer that contact the first pixel electrode, the second pixel electrode, and the third pixel electrode, respectively, may have a dome shape.

The display device may further include a dummy insulating layer between the via-insulating layer and at least one of the first pixel electrode, the second pixel electrode, and the third pixel electrode.

A first dummy insulating layer, a second dummy insulating layer, and a third dummy insulating layer may be arranged between the via-insulating layer and each of the first pixel electrode, the second pixel electrode, and the third pixel electrode, respectively, and the first dummy insulating layer, the second dummy insulating layer, and the third dummy insulating layer may have different thicknesses from each other.

An upper surface of the dummy insulating layer may have a dome shape.

The display device may further include a capping layer between the opposite electrode and the upper substrate.

Air may be filled in a space between the opposite electrode and the upper substrate.

A filler may be filled in a space between the opposite electrode and the upper substrate, and an optical distance between the first region and the upper substrate satisfies the equation below:

$D1=n_f \times D1p$, where $n_f$ denotes a refractive index of the filler, and D1p denotes a physical distance between the first region and the upper substrate.

According to one or more embodiments, a method of manufacturing a display device, includes forming a pixel circuit layer including at least one thin-film transistor, on a substrate, forming a via-insulating layer on the pixel circuit layer, forming a first pixel electrode on the via-insulating layer, forming a bank layer on the via-insulating layer, the bank layer defining a first opening exposing at least a portion of the first pixel electrode, forming a first intermediate layer on the first pixel electrode by ejecting ink including a light-emitting material which emits light including light of a first wavelength, forming an opposite electrode including a first region overlapping the first intermediate layer in a plan view, on the bank layer and the first intermediate layer, and forming an upper substrate on the opposite electrode, wherein an optical distance D1 between the first region and the upper substrate satisfies the equation below:

$D1=A+(\lambda 1)/2 \times n$, where A denotes the minimum optical distance between the first region and the upper substrate at a point where light of $\lambda 1$ has a maximum intensity, n is an integer equal to or greater than 0, and $\lambda 1$ denotes the first wavelength.

The method may further include forming a second pixel electrode and a third pixel electrode on the via-insulating layer, and forming a second intermediate layer arranged on the second pixel electrode and which emits light including light of a second wavelength and a third intermediate layer arranged on the third pixel electrode and which emits light including light of a third wavelength.

The forming of the via-insulating layer may include forming, by using a halftone mask, the via-insulating layer that has different thicknesses in portions that overlap the first pixel electrode, the second pixel electrode, and the third pixel electrode, respectively.

In the forming of the via-insulating layer, portions of an upper surface of the via-insulating layer, the portions contacting the first pixel electrode, the second pixel electrode, and the third pixel electrode, respectively, may be formed in a dome shape.

The method may further include, after the forming of the via-insulating layer, forming a first dummy insulating layer between the via-insulating layer and the first pixel electrode, a second dummy insulating layer between the via-insulating layer and the second pixel electrode, and a third dummy insulating layer between the via-insulating layer and the third pixel electrode, wherein thicknesses of the first dummy insulating layer, the second dummy insulating layer, and the third dummy insulating layer are different from each other.

In the forming of the first dummy insulating layer, the second dummy insulating layer, the third dummy insulating layer, upper surfaces of the first dummy insulating layer, the second dummy insulating layer, and the third dummy insulating layer may be formed in a dome shape.

The method may further include, after forming of the upper substrate, filling a filler between the opposite electrode and the upper substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
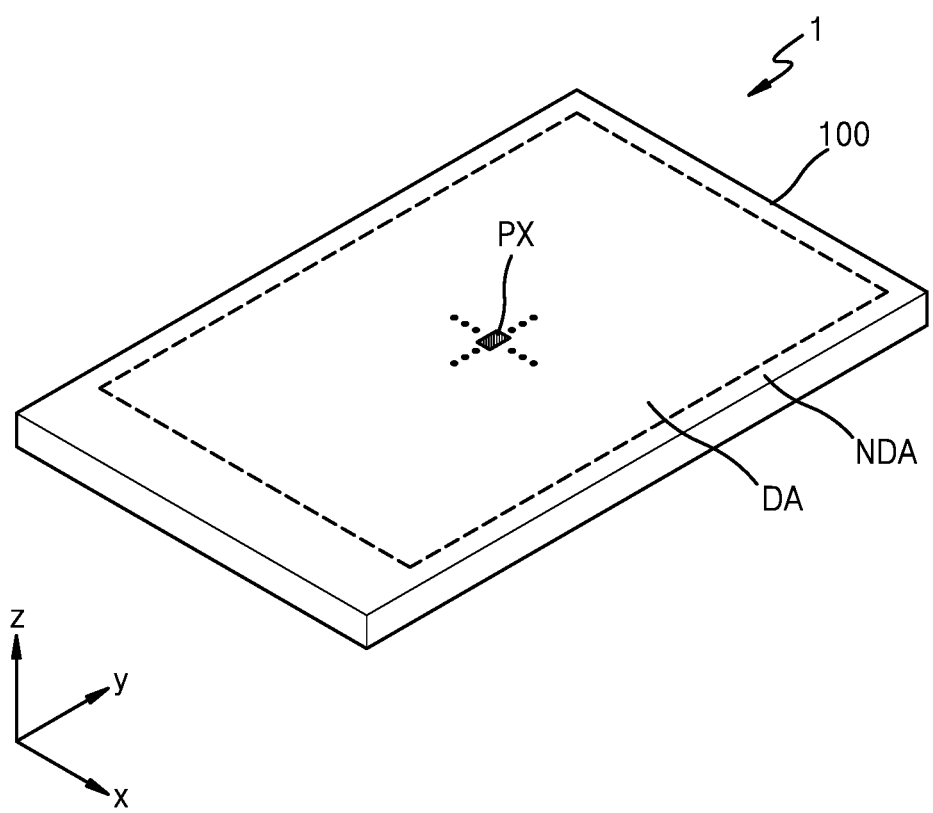
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Since the present disclosure may have various modifications and several embodiments, embodiments are shown in the drawings and will be described in detail. The effects and features of the present disclosure, and ways to achieve them will become apparent by referring to embodiments that will be described later in detail with reference to the drawings. However, the present disclosure is not limited to the following embodiments but may be embodied in various forms.

Hereinafter, embodiments of the present disclosure will be described in detail with reference to the accompanying drawings, and in the description with reference to the drawings, like reference numerals refer to like elements and redundant descriptions thereof will be omitted.

It will be understood that although the terms "first," "second," etc., may be used herein to describe various elements, these elements should not be limited by these terms. These terms are only used to distinguish one element from another.

In the embodiments below, the singular forms include the plural forms unless the context clearly indicates otherwise.

In the present specification, it is to be understood that the terms such as "including" or "having" are intended to indicate the existence of the features or elements disclosed in the specification, and are not intended to preclude the possibility that one or more other features or elements may be added.

In the embodiments below, it will be understood that when a portion such as a layer, an area, or an element is referred to as being "on" or "above" another portion, it can be directly on or above the other portion, or intervening portion may also be present.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

When an embodiment is implementable in another manner, a predetermined process order may be different from a described one. For example, two processes that are consecutively described may be substantially simultaneously performed or may be performed in an opposite order to the described order.

In the embodiments below, it will be understood that when a portion such as a layer, an area, or an element is referred to as being "connected" to" another portion, it can be directly connected to the other portion, or an intervening portion may also be present. For example, throughout the specification, it will be understood when a portion such as a layer, an area, or an element is referred to as being "electrically connected" to another portion, it can be directly electrically connected to the other portion, or it can be indirectly electrically connected with an intervening portion therebetween.

A display device is a device displaying images, and may be a portable mobile device such as a game player, a multimedia device, and a micro personal computer ("PC"). Examples of a display device to be described later may include a liquid crystal display, an electrophoretic display, an organic light-emitting display, an inorganic electroluminescent ("EL") display, a field emission display, a surface-conduction electron-emitter display, a quantum dot display, a plasma display, and a cathode ray display. Hereinafter, an organic light-emitting display device will be described as an example of the display device according to an embodiment. However, various types of display devices as described above may be used in the embodiments.

FIG. 1 is a schematic perspective view of a display device 1 according to an embodiment.

Referring to FIG. 1, the display device 1 may include a display area DA and a non-display area NDA on a substrate 100.

The display area DA may display an image. Pixels PX may be arranged in the display area DA. An image may be provided using light emitted from the pixels PX.

The non-display area NDA is an area that does not provide an image, and the pixels PX are not arranged in the non-display area NDA. The non-display area NDA may entirely surround the display area DA. The non-display area NDA may include, for example, a driver for providing an electrical signal or power to the pixels PX. The non-display area NDA may include a pad portion (not shown) that is an area to which an electronic device or a printed circuit board may be electrically connected.

Figure 2:
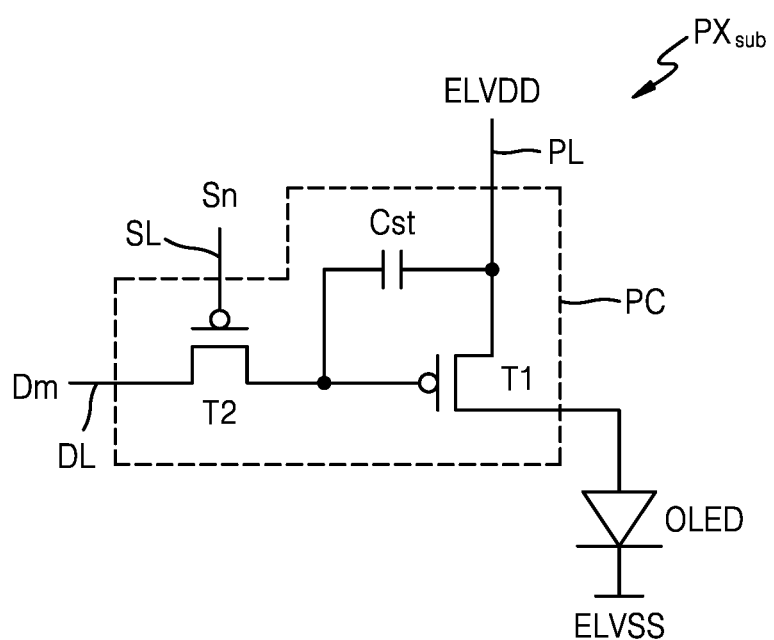
FIG. 2 is an equivalent circuit diagram of a sub-pixel included in a display device according to an embodiment.

FIG. 2 is an equivalent circuit diagram of a pixel PX included in a display device according to an embodiment.

Referring to FIG. 2, a sub-pixel $PX_{sub}$ may include a pixel circuit PC and a display element connected to the pixel circuit PC, for example, an organic light-emitting diode OLED. The pixel circuit PC may include a first thin film transistor T1, a second thin film transistor T2, and a storage capacitor Cst. Each sub-pixel $PX_{sub}$ may emit light of, for example, red, green, blue or white color through the organic light-emitting diode OLED.

The second thin film transistor T2 may be a switching thin film transistor and be connected to a scan line SL and a data line DL, and may be configured to transfer a data voltage or a data signal Dm received from the data line DL to the first thin film transistor T1, based on a switching voltage or a switching signal Sn received from the scan line SL. The storage capacitor Cst may be connected to the second thin film transistor T2 and a driving voltage line PL and may store a voltage corresponding to a difference between a voltage received from the second thin film transistor T2 and a driving voltage ELVDD supplied to the driving voltage line PL.

The first thin film transistor T1 may be a driving thin film transistor and be connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light of a certain brightness, according to the driving current. An opposite electrode (e.g., cathode) of the organic light-emitting diode OLED may receive a second power voltage ELVSS.

Although FIG. 2 illustrates that the pixel circuit PC includes two thin film transistors and one storage capacitor, in another embodiment, a number of thin film transistors and a number of storage capacitors may be variously changed according to a design of the pixel circuit PC.

Figure 3:
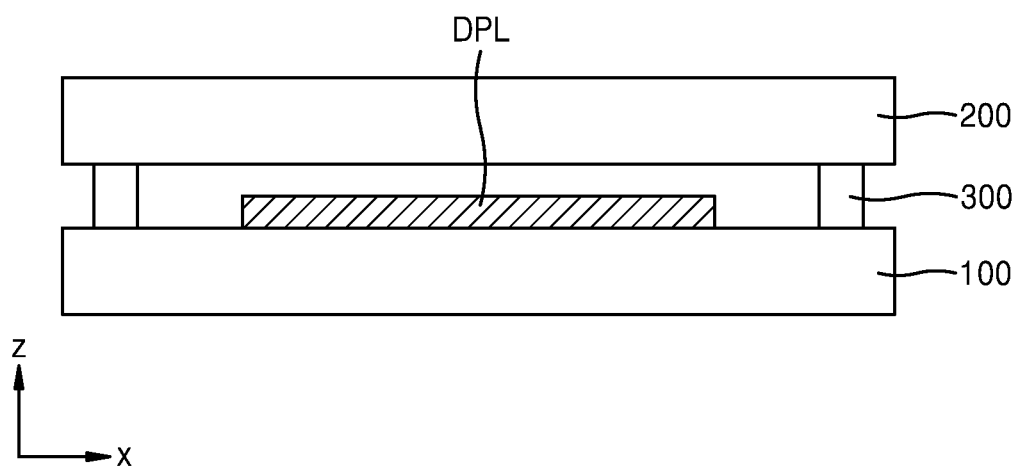
FIG. 3 is a cross-sectional view schematically illustrating a display device according to an embodiment.

FIG. 3 is a cross-sectional view schematically illustrating the display device 1 according to an embodiment.

Referring to FIG. 3, a display layer DPL may be arranged on a substrate 100 of the display device 1. The display layer DPL may include a pixel circuit layer PCL including a pixel circuit and insulating layers and a display element layer including a plurality of display elements on the pixel circuit layer PCL.

In an embodiment, for example, the substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate ("TAC"), or cellulose acetate propionate.

The display element layer may include display elements, for example, an organic light-emitting diode. The pixel circuit layer PCL may include a pixel circuit and insulating layers connected to the organic light-emitting diode.

An upper substrate 200 may be arranged on the display layer DPL of the display device 1. The upper substrate 200 may be coupled to the substrate 100 by using an encapsulation member 300 to encapsulate an inner space between the substrate 100 and the upper substrate 200. In the inner space, air, a moisture absorbent, a filler, or the like, may be located.

In some embodiments, the display layer DPL may be covered using a thin film encapsulation layer including at least one inorganic encapsulation layer and at least one organic encapsulation layer. That is, the display layer DPL may be encapsulated using the thin film encapsulation layer and the upper substrate 200.

Figure 4:
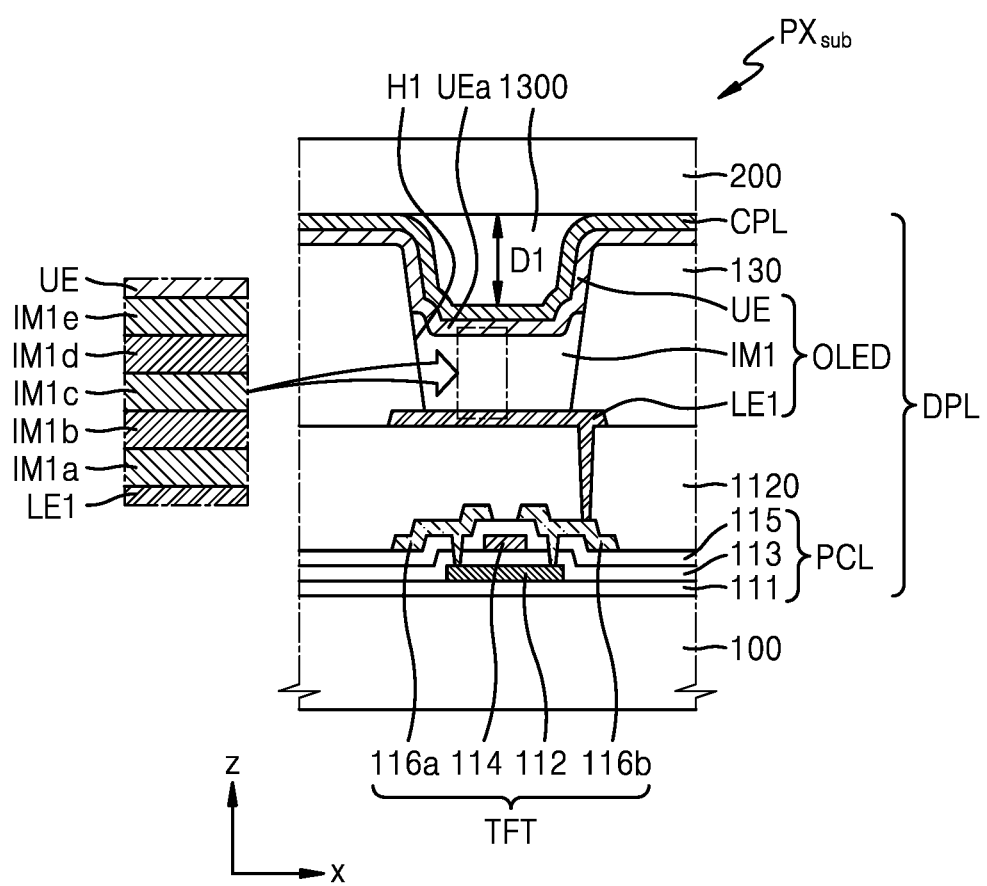
FIG. 4 is a cross-sectional view schematically illustrating a sub-pixel of a display device according to an embodiment.

In FIG. 3, the display layer DPL and the upper substrate 200 are illustrated as being apart from each other, but the present disclosure according to the invention is not limited thereto. As shown in FIG. 4, the display layer DPL and the upper substrate 200 may be partially connected to each other in another embodiment.

Although not shown, a touch electrode layer may be arranged on the upper substrate 200, and an optical functional layer may be arranged on the touch electrode layer. The touch electrode layer may acquire coordinate information according to an external input, for example, a touch event. The optical functional layer may reduce reflectance of light (external light) incident from the outside toward the display device 1 and/or may improve color purity of light emitted from the display device 1.

FIG. 4 is a cross-sectional view schematically illustrating a sub-pixel of a display device according to an embodiment.

Referring to FIG. 4, the same reference numerals as those of FIG. 3 denote the same elements, and thus repeated descriptions will be omitted.

The display device 1 according to an embodiment includes a substrate 100, a pixel circuit layer PCL arranged on the substrate 100, a via-insulating layer 1120 arranged on the pixel circuit layer PCL, and an organic light-emitting diode OLED arranged on the via-insulating layer 1120. The organic light-emitting diode OLED includes a first pixel electrode LE1 arranged on the via-insulating layer 1120, a first intermediate layer IM1 arranged on the first pixel electrode LE1 and emitting light including light of a first wavelength λ1, and an opposite electrode UE arranged on the first intermediate layer IM1.

A bank layer 130 defining a first opening H1 exposing at least a portion of the first pixel electrode LE1 may be arranged on the via-insulating layer 1120, and the upper substrate 200 may be arranged above the opposite electrode UE.

The pixel circuit layer PCL includes at least one thin film transistor TFT and a plurality of insulating layers 111, 113, and 115 arranged on the substrate 100.

A buffer layer 111 may be between the substrate 100 and the thin film transistor TFT. The buffer layer 111 may include an inorganic insulating material such as silicon nitride, silicon oxynitride, and silicon oxide, and may have a single layer structure or a multilayer structure including the inorganic insulating material described above.

The thin film transistor TFT includes a semiconductor layer 112, and the semiconductor layer 112 may include polysilicon, amorphous silicon, an oxide semiconductor, or an organic semiconductor. The semiconductor layer 112 may include a channel region and a drain region and a source region arranged at opposite sides of the channel region, respectively.

A gate electrode 114 may be arranged above the semiconductor layer 112, and the gate electrode 114 may include a low-resistance metal material. The gate electrode 114 may include a conductive material including molybdenum (Mo), aluminum (Al), copper (Cu), titanium (Ti), and the like, and may be formed as a multi-layer or single-layer structure including the above material.

A gate insulating layer 113 between the semiconductor layer 112 and the gate electrode 114 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An interlayer-insulating layer 115 may be arranged on the gate electrode 114, and the interlayer-insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer-insulating layer 115 may be formed as a multi-layer or a single layer including the above-described inorganic insulating material.

A drain electrode 116a and a source electrode 116b may be located on the interlayer-insulating layer 115. The drain electrode 116a and the source electrode 116b may be connected to the drain region and the source region of the semiconductor layer 112, respectively, through contact holes defined in the gate insulating layer 113 and the interlayer-insulating layer 115. The drain electrode 116a and the source electrode 116b may include a material having high conductivity. The drain electrode 116a and the source electrode 116b may include a conductive material including molybdenum (Mo), aluminum (Al), copper (Cu), titanium (Ti), or the like, and may be formed as a multi-layer or single-layer structure including the above materials. According to an embodiment, the drain electrode 116a and the source electrode 116b may have a multi-layered structure of Ti/Al/Ti.

The via-insulating layer 1120 covering the thin film transistor TFT may be arranged on the pixel circuit layer PCL. The via-insulating layer 1120 may include an organic insulating material, and may include, for example, a general-purpose polymer such as polymethylmethacrylate ("PMMA") or polystyrene ("PS"), a polymer derivative having a phenol group, an acryl-based polymer, an imide-based polymer, an arylether-based polymer, an amide-based polymer, a fluorine-based polymer, a p-xylene-based polymer, a vinyl alcohol-based polymer, or a combination thereof.

The first pixel electrode LE1 and the bank layer 130 may be arranged on the via-insulating layer 1120, and the bank layer 130 may define the first opening H1 exposing at least a portion of the first pixel electrode LE1. The bank layer 130 may include a photoresist, that is, a photosensitive resin. For example, the bank layer 130 may include polyimide, acrylic, a maleic anhydride/norbornene copolymer, a hydroxystyrene/acrylate copolymer, a methacrylate copolymer, diazonaphthoquinone ("DNQ"), or a novolac resin. The bank layer 130 may include a material having lyophilicity or hydrophilicity.

The first pixel electrode LE1 may be electrically connected to a circuit unit such as the thin film transistor TFT included in the pixel circuit layer PCL through a via-hole defined in the via-insulating layer 1120. The first pixel electrode LE1 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a conductive oxide such as an indium tin oxide ("ITO"), an indium zinc oxide ("IZO"), a zinc oxide (ZnO), an indium oxide ($In_2O_3$), an indium gallium oxide ("IGO"), or aluminum zinc oxide ("AZO") may be further arranged above and/or below the reflective layer. The first pixel electrode LE1 may include a reflective electrode, and the organic light-emitting diode OLED may be a top emission-type organic light-emitting diode that emits light toward the upper substrate 200.

The first intermediate layer IM1 may be arranged on the first pixel electrode LE1. The first intermediate layer IM1 may be arranged in the first opening H1 of the bank layer 130, and a thickness of the first intermediate layer IM1 in a thickness direction (i.e., z direction) may be greater in an edge region than in a center region. That is, the edge region of the first intermediate layer IM1 may be thicker than the central region thereof. The first intermediate layer IM1 may be formed by ejecting ink including an organic material onto the first pixel electrode LE1 and then drying the ink.

The first intermediate layer IM1 may include an emission layer IM1c including a polymer or a low molecular weight organic material emitting light of a certain color, and a hole injection layer ("HIL") IM1a and/or a hole transport layer ("HTL") IM1b may be arranged under the emission layer IM1c, and an electron transport layer ("ETL") IM1d and/or an electron injection layer ("EIL") IM1e may be arranged on the emission layer IM1c.

According to an embodiment, at least one of the hole injection layer IM1a, the hole transport layer IM1b, the electron transport layer IM1d, and the electron injection layer IM1e may function as a distance control layer for controlling a resonance distance between the first pixel electrode LE1 and the opposite electrode UE. According to another embodiment, an additional distance control layer may be arranged between the first pixel electrode LE1 and the opposite electrode UE.

The opposite electrode UE may be arranged on the first intermediate layer IM1 and the bank layer 130. The opposite electrode UE may include a conductive material having a low work function. For example, the opposite electrode UE may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

A distance between the first pixel electrode LE1 and the opposite electrode UE in the thickness direction may be set to satisfy a resonance condition for amplifying light having a certain wavelength to be emitted toward the opposite electrode UE. The distance between the first pixel electrode LE1 and the opposite electrode UE is measured from a center of the opposite electrode UE overlapping the pixel electrode LE1 in a plan view. For example, the distance is measured at the point of the arrow of D1 in FIG. 4. According to an embodiment, the organic light-emitting diode OLED may emit light including light of the first wavelength $\lambda 1$, and a distance between the first pixel electrode LE1 and the opposite electrode UE may be set on condition that the light of the first wavelength $\lambda 1$ has a maximum intensity.

In detail, the emission layer IM1c may be an organic material emitting light including light of the first wavelength $\lambda 1$, and the light emitted from the emission layer IM1c has a spectrum of a wide full width at half maximum. That is, the light emitted from the emission layer IM1c includes not only the first wavelength $\lambda 1$ but also lights of a certain wavelength band including the first wavelength $\lambda 1$.

However, to improve light efficiency and image quality of a display device, it is desirable for a spectrum of light emitted from the organic light-emitting diode OLED to have a narrow full width at half maximum. To amplify light of a desired specific wavelength, for example, the first wavelength $\lambda 1$, and reduce an intensity of light of the other wavelengths, it is desirable for the distance between the first pixel electrode LE1 and the opposite electrode UE to satisfy a resonance condition for amplifying the first wavelength $\lambda 1$.

However, it is not possible that the organic light-emitting diode OLED emits only light of the first wavelength $\lambda 1$, and light emitted through the opposite electrode UE also has a certain wavelength. In particular, when the first intermediate layer IM1 is formed using a printing method, it is difficult to adjust a thickness of the first intermediate layer IM1, and thus there is a limit in perfectly adjusting the above-described process condition.

The upper substrate 200 may be arranged above the opposite electrode UE, and a capping layer CPL may be additionally arranged between the opposite electrode UE and the upper substrate 200. In addition, although not shown, in another embodiment, a thin film encapsulation layer may be further arranged on the capping layer CPL. The opposite electrode UE may be integrally formed over a plurality of sub-pixels $PX_{sub}$, and a region of the opposite electrode UE contacting the first intermediate layer IM1 may be defined as a first region UEa.

An optical distance of a material is defined as a length obtained by multiplying a corresponding physical length of the material by a refractive index of the material. According to an embodiment, an optical distance D1 between the opposite electrode UE and the upper substrate 200 may satisfy the following equation:

$$D1 = A + (\lambda 1)/2 \times n \qquad \text{<Equation>}$$

Here, A denotes an optical distance between the first region UEa of the opposite electrode UE and the upper substrate 200 at a point where light of $\lambda 1$ has a maximum intensity for a first time (in other words, A denotes the minimum optical distance between the first region UEa of the opposite electrode UE and the upper substrate 200 at a point where light of $\lambda 1$ has a maximum intensity), n is an integer equal to or greater than 0, and $\lambda 1$ denotes the first wavelength.

As described above, the first wavelength $\lambda 1$ may be a wavelength selected from a wavelength range of light emitted from the organic light-emitting diode OLED. The first wavelength $\lambda 1$ may be a wavelength that is intended to be emitted at a maximum intensity from a corresponding sub-pixel $PX_{sub}$ in the display device 1.

A denotes an optical distance between the first region UEa of the opposite electrode UE and the upper substrate 200 at a point where $\lambda 1$ has a maximum intensity for a first time. That is, A denotes the minimum optical distance between the first region UEa of the opposite electrode UE and the upper substrate 200 at a point where $\lambda 1$ has a maximum intensity. A reference point of the first region UEa with respect to the optical distance D1 may be an area of the first region UEa corresponding to a center of the first intermediate layer IM1, and the optical distance D1 may be an optical distance between a center of an upper surface of the first region UEa and a lower surface of the upper substrate 200. The optical distance will be described later.

According to an embodiment, air may be filled between the opposite electrode UE and the upper substrate 200. In this case, since a refractive index of air is 1, the optical distance and the physical distance may be equal to each other. As illustrated in FIG. 4, when the capping layer CPL is additionally arranged between the opposite electrode UE and the upper substrate 200, the optical distance may be a value obtained by adding a distance between the capping layer CPL and the upper substrate 200 to a distance obtained by multiplying a refractive index of the capping layer CPL by a thickness of the capping layer CPL in the thickness direction (i.e., z direction).

Light emitted from the organic light-emitting diode OLED may be reflected on the lower surface of the upper substrate 200, and the reflected light may be reflected again on the upper surface of the opposite electrode UE. That is, a portion of the light may be repeatedly reflected and re-reflected between the upper substrate 200 and the opposite electrode UE.

According to an embodiment, efficiency of a display device may be improved by setting a distance between the opposite electrode UE and the upper substrate 200 to satisfy a resonance condition. As described above, a resonance structure may be formed between the first pixel electrode LE1 and the opposite electrode UE, and furthermore, a resonance structure may be formed also between the opposite electrode UE and the upper substrate 200, thereby further improving light efficiency of the display device.

Figure 5:
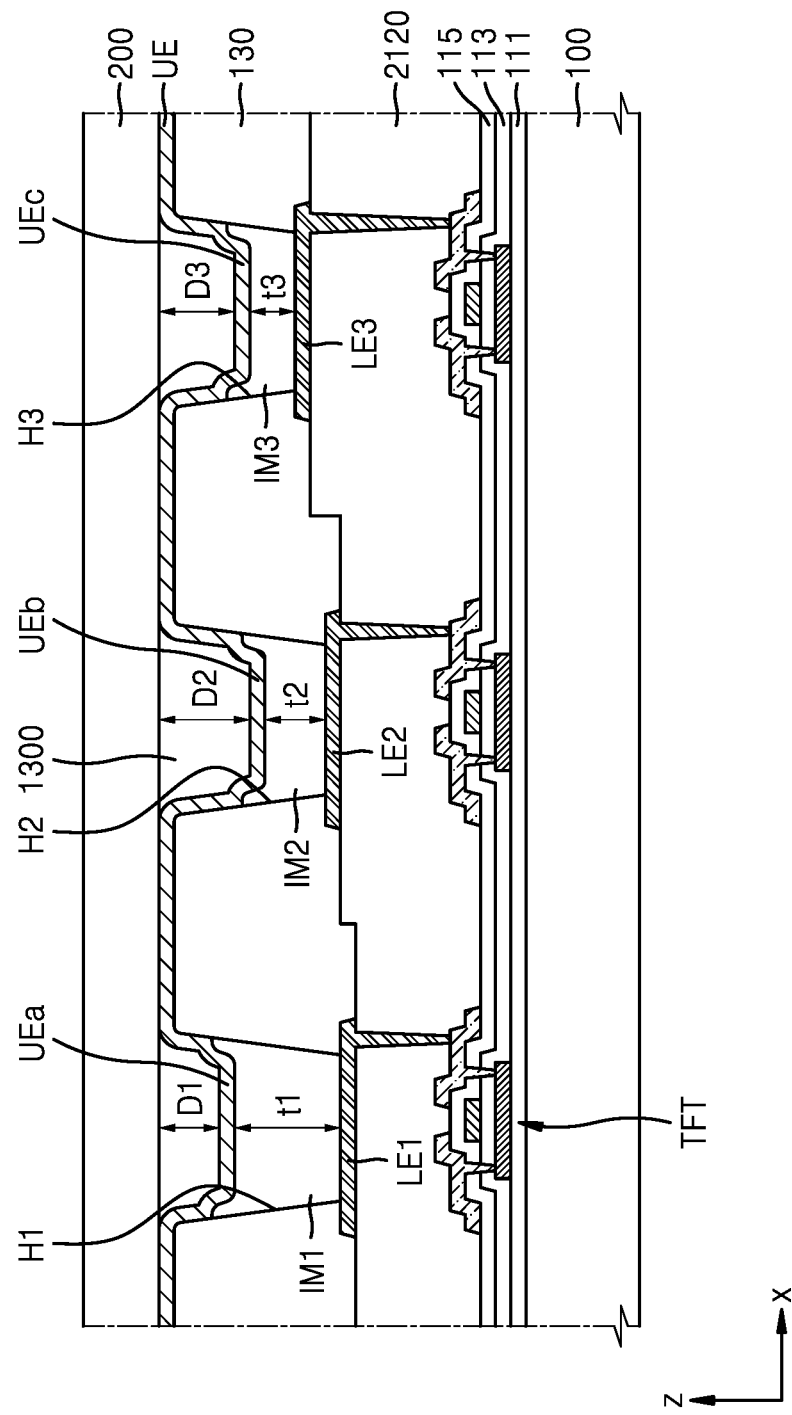
FIG. 5 is a cross-sectional view schematically illustrating a pixel of a display device according to an embodiment.
Figure 6:
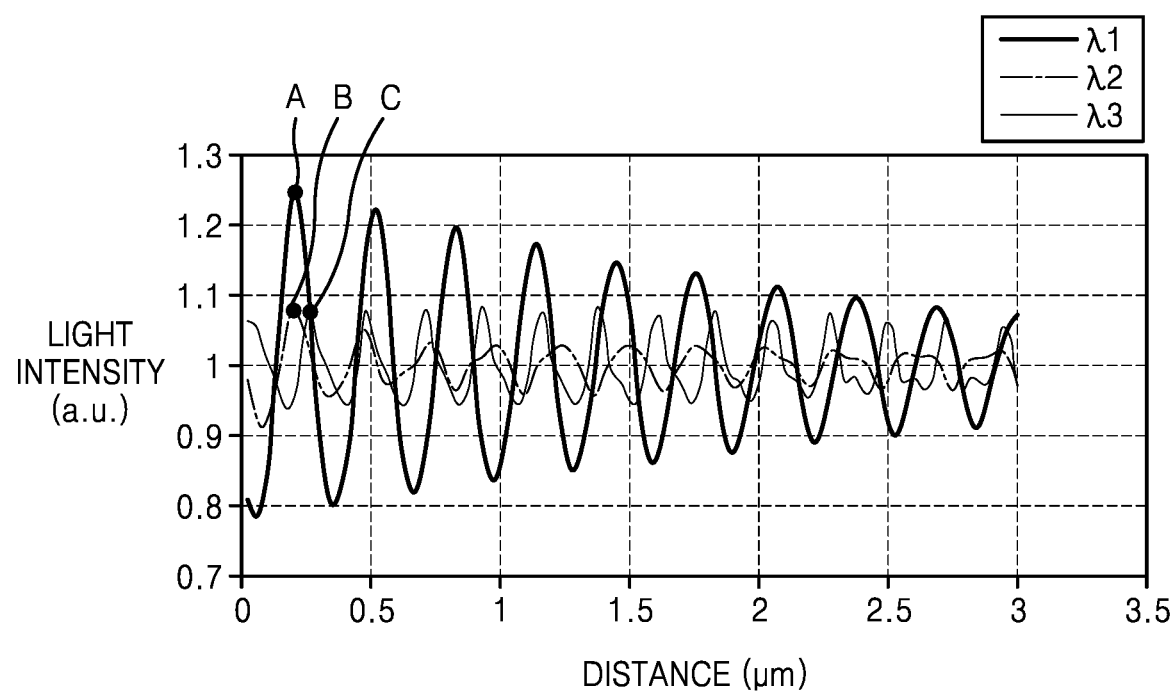
FIG. 6 is a graph showing intensities of light of a first wavelength, a second wavelength, and a third wavelength according to a distance between an opposite electrode and an upper substrate of FIG. 5.

FIG. 5 is a cross-sectional view schematically illustrating a pixel of a display device according to an embodiment. FIG. 6 is a graph showing intensities of light of a first wavelength, a second wavelength, and a third wavelength according to a distance between an opposite electrode and an upper substrate of FIG. 5. Regarding the display device of FIG. 5, the same reference numerals as those of FIG. 4 denote the same elements, and thus repeated descriptions will be omitted.

Referring to FIG. 5, a pixel PX of the display device according to an embodiment includes a substrate 100, a pixel circuit layer PCL arranged on the substrate 100 and including at least one thin film transistor TFT, a via-insulating layer 2120 arranged on the pixel circuit layer PCL, and a first pixel electrode LE1, a second pixel electrode LE2, and a third pixel electrode LE3 arranged on the via-insulating layer 2120. A bank layer 130 defining a first opening H1, a second opening H2, and a third opening H3 exposing at least a portion of each of the first pixel electrode LE1, the second pixel electrode LE2, and the third pixel electrode LE3, respectively, is arranged on the via-insulating layer 2120. A first intermediate layer IM1, a second intermediate layer IM2, and a third intermediate layer IM3 are arranged in the first opening H1, the second opening H2, and the third opening H3, respectively.

The first intermediate layer IM1 may be arranged on the first pixel electrode LE1 and emit light including light of a first wavelength λ1. The second intermediate layer IM2 may be arranged on the second pixel electrode LE2 and emit light including light of a second wavelength λ2, and the third intermediate layer IM3 may be arranged on the third pixel electrode LE3 and emit light including light of a third wavelength λ3.

According to an embodiment, the first wavelength λ1, the second wavelength λ2, and the third wavelength λ3 may correspond to red light, green light, and blue light, respectively. The first wavelength λ1 may be a wavelength selected from a wavelength range of light emitted from the first intermediate layer IM1, and the first wavelength λ1 may be a wavelength intended to be emitted at a maximum intensity in a red sub-pixel. The second wavelength λ2 and the third wavelength λ3 may be wavelengths selected from wavelength ranges of light emitted from the second intermediate layer IM2 and the third intermediate layer IM3, respectively, and may be wavelengths intended to be emitted at a maximum intensity in a green sub-pixel and a blue sub-pixel, respectively.

As described above, distances between the first through third pixel electrodes LE1, LE2, and LE3 and the opposite electrode UE may be set to satisfy a resonance condition, and thus thicknesses t1, t2, and t3 of the first intermediate layer IM1, the second intermediate layer IM2, and the third intermediate layer IM3 may be different from each other.

The opposite electrode UE may be arranged on the bank layer 130, the first intermediate layer IM1, the second intermediate layer IM2, and the third intermediate layer IM3, and the opposite electrode UE may include a first region UEa overlapping the first intermediate layer IM1, a second region UEb overlapping the second intermediate layer IM2, and a third region UEc overlapping the third intermediate layer IM3. Here, "overlapping" means that corresponding elements are overlapped when viewed (i.e., plan view) in a direction (i.e., z direction) perpendicular to a main surface of the substrate 100. The upper substrate 200 may be arranged on the opposite electrode UE. Air 1300 may be filled in a space between the opposite electrode UE and the upper substrate 200. Although not shown, as shown in FIG. 4, a capping layer CPL may be further arranged on the opposite electrode UE.

An optical distance D1 between the first region UEa and the upper substrate 200, an optical distance D2 between the second region UEb and the upper substrate 200, and an optical distance D3 between the third region UEc and the upper substrate 200 may satisfy the following equations, respectively. Hereinafter, D1, D2, and D3 are referred to as a first optical distance, a second optical distance, and a third optical distance, respectively.

$$D1 = A + (\lambda 1)/2 \times n1$$

$$D2 = B + (\lambda 2)/2 \times n2$$

$$D3 = C + (\lambda 3)/2 \times n3 \quad \text{<Equations>}$$

Here, A denotes an optical distance between the first region UEa of the opposite electrode UE and the upper substrate 200 at a point where light of λ1 has a maximum intensity for a first time (in other words, A denotes the minimum optical distance between the first region UEa of the opposite electrode UE and the upper substrate 200 at a point where light of λ1 has a maximum intensity), B denotes an optical distance between the second region UEb of the opposite electrode UE and the upper substrate 200 at a point where light of λ2 has a maximum intensity for a first time (in other words, B denotes the minimum optical distance between the second region UEb of the opposite electrode UE and the upper substrate 200 at a point where light of λ2 has a maximum intensity), and C denotes an optical distance between the third region UEc of the opposite electrode UE and the upper substrate 200 at a point where light of λ3 has a maximum intensity for a first time (in other words, C denotes the minimum optical distance between the second region UEc of the opposite electrode UE and the upper substrate 200 at a point where light of λ3 has a maximum intensity). n1, n2, and n3 represent integers equal to or greater than 0, and n1, n2, and n3 may be different integers from each other. λ1, λ2, and λ3 denote the first wavelength, the second wavelength, and the third wavelength, respectively.

Reference points of the first region UEa, the second region UEb, and the third region UEc with respect to the first through third optical distances D1 through D3 may be a portion of each of the first region UEa, the second region UEb, and the third region UEc corresponding to centers of the first intermediate layer IM1, the second intermediate layer IM2, and the third intermediate layer IM3, respectively. The first through third optical distances D1 through D3 may be a distance between an upper surface of the first region UEa and a lower surface of the upper substrate 200, a distance between an upper surface of the second region UEb and the lower surface of the upper substrate 200, and a distance between an upper surface of the third region UEc and the lower surface of the upper substrate 200, respectively.

Referring to FIG. 6, intensities of light of the first wavelength λ1, the second wavelength λ2, and the third wavelength λ3 according to the distance D between the opposite electrode UE and the upper substrate 200 are shown. A, B, and C denote distances at points where light of the first wavelength, the second wavelength, and the third wavelength have a maximum intensity for a first time, respectively. The intensity of light is expressed in an arbitrary unit.

When n1, n2, and n3 are 0 in the above equations, A, B, and C may be equal to D1, D2, and D3, respectively.

In FIG. 5, the second optical distance D2 is the largest and the first optical distance D1 is the smallest, but the present disclosure according to the invention is not limited thereto. Sizes of the first through third optical distances D1, D2, and D3 may vary according to the values of n1, n2, and n3.

According to an embodiment, the thicknesses t1, t2, and t3 of the first intermediate layer IM1, the second intermediate layer IM2, and the third intermediate layer IM3 may be different from each other, and the first optical distance D1, the second optical distance D2, and the third optical distance D3 may also be different from each other. In order to set the first through third optical distances D1, D2, and D3 to satisfy a resonance condition, the via-insulating layer 2120 may have different thicknesses in portions thereof corresponding to the first pixel electrode LE1, the second pixel electrode LE2, and the third pixel electrode LE3, respectively. Therefore, an upper surface of the via-insulating layer 2120 may not be flat. In FIG. 5, the via-insulating layer 2120 is the thinnest under the first pixel electrode LE1 and the thickest under the third pixel electrode LE3. However, the present disclosure according to the invention is not limited thereto. That is, in order to set the first to third optical distances D1, D2, and D3 to desired distances, thicknesses of regions of the via-insulating layer 210 corresponding to respective sub-pixels may vary.

According to an embodiment, by setting a distance between the opposite electrode UE and the upper substrate 200 to satisfy a resonance condition in each of a red sub-pixel, a green sub-pixel, and a blue sub-pixel, light efficiency and quality of a display device may be improved.

Figure 7:
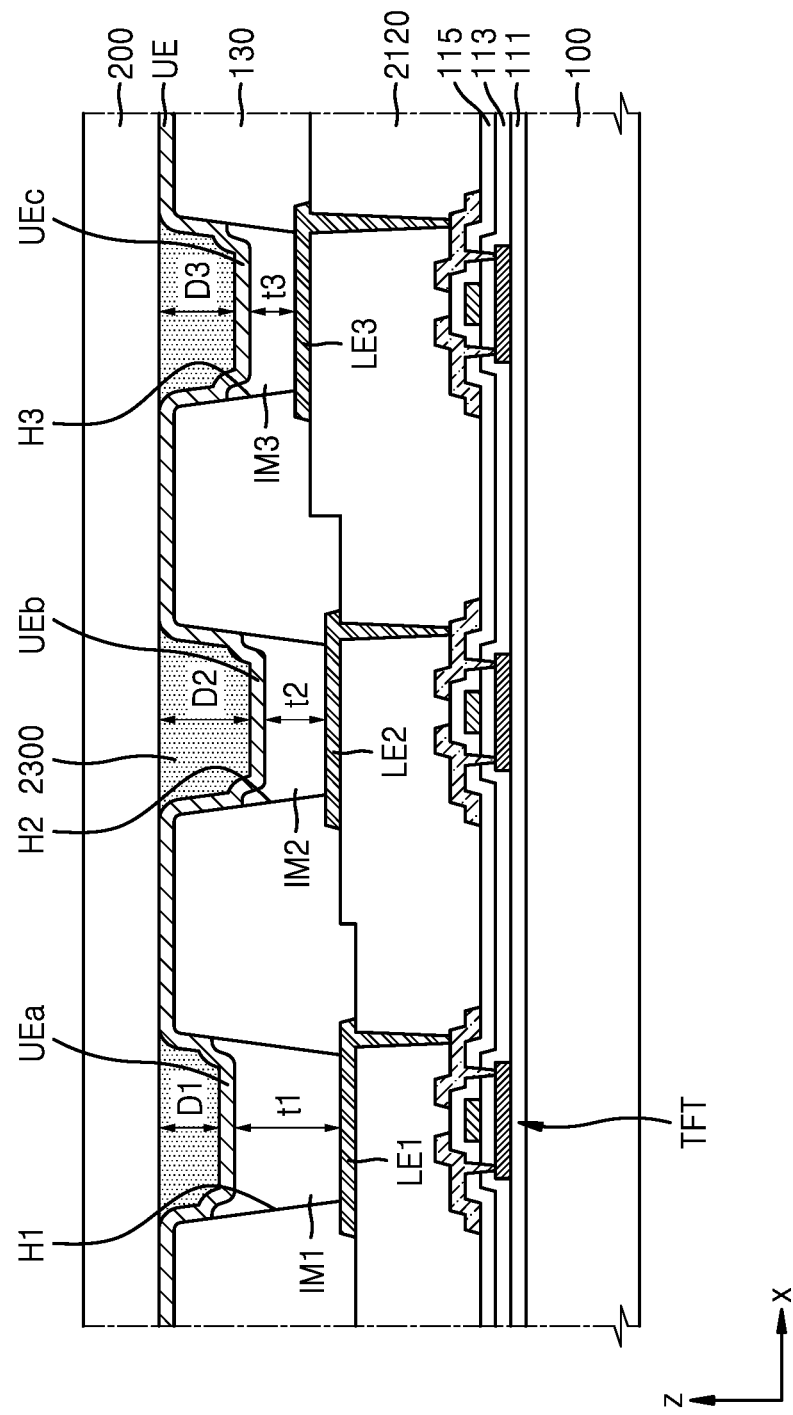
FIG. 7 is a cross-sectional view schematically illustrating a display device according to another embodiment.

FIG. 7 is a cross-sectional view schematically illustrating a display device according to another embodiment. Regarding the display device of FIG. 7, the same reference numerals as those of FIG. 5 denote the same elements, and thus repeated descriptions will be omitted.

Referring to FIG. 7, the display device of FIG. 7 includes the same components as those of the display device of FIG. 5, except that a filler 2300 instead of air is filled between the opposite electrode UE and the upper substrate 200.

The filler 2300 may have a certain refractive index of which a value is over 1, and thus, an optical distance between the opposite electrode UE and the upper substrate 200 may be determined by multiplying the refractive index of the filler 2300 by a physical distance between the opposite electrode UE and the upper substrate 200.

In an embodiment, for example, the first optical distance D1 between the first region UEa of the opposite electrode UE and the upper substrate 200 may satisfy the following equation.

$$D1 = n_f \times D1p \quad \text{<Equation>}$$

Here, $n_f$ denotes a refractive index of the filler 2300, D1p denotes a physical distance between the first region UEa and the upper substrate 200 in the thickness direction (i.e., z direction).

When another layer is between the opposite electrode UE and the upper substrate 200, an optical distance due to the other layer is to be taken into consideration.

Figure 8:
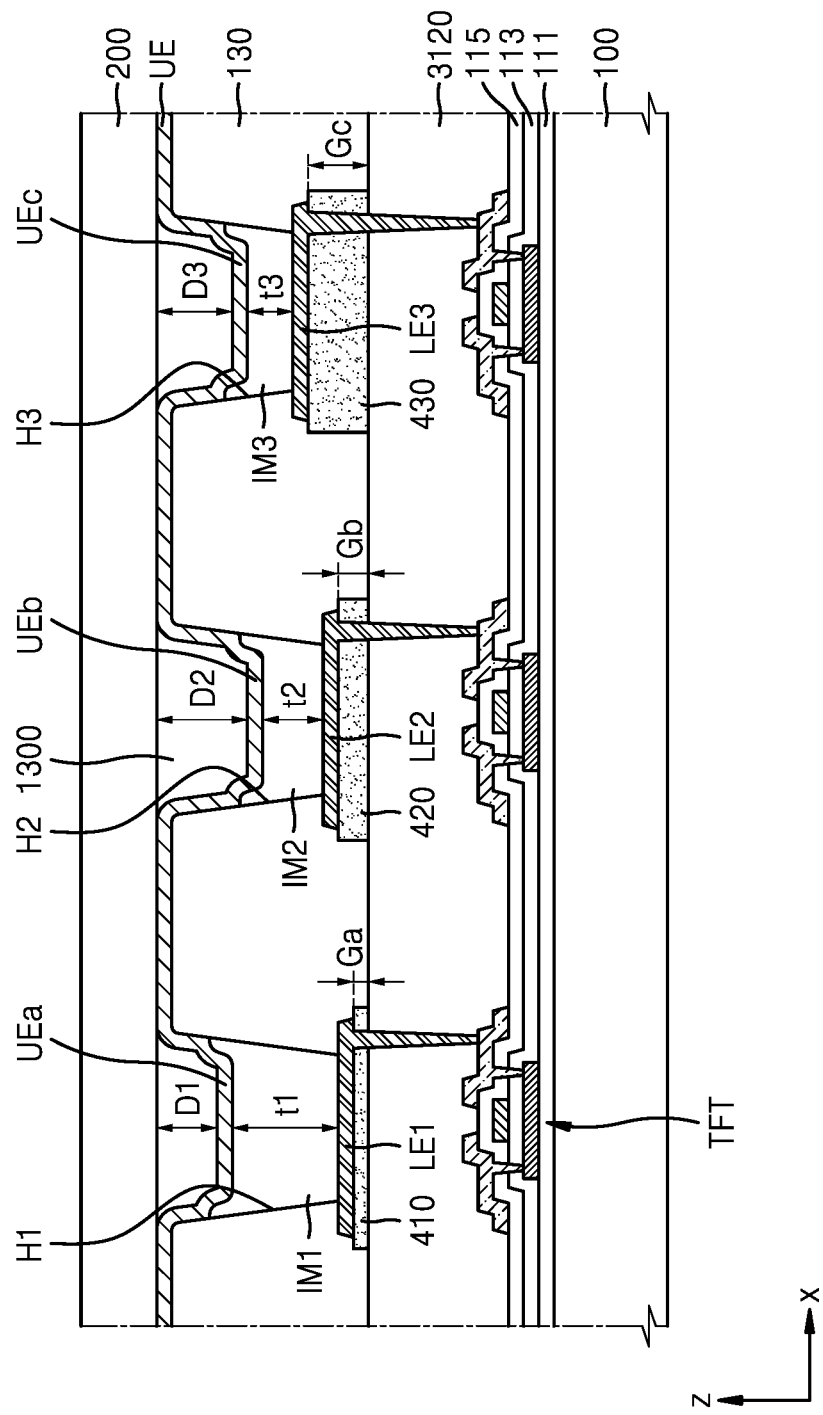
FIGS. 8 through 10 are cross-sectional views schematically illustrating a display device according to other embodiments.
Figure 9:
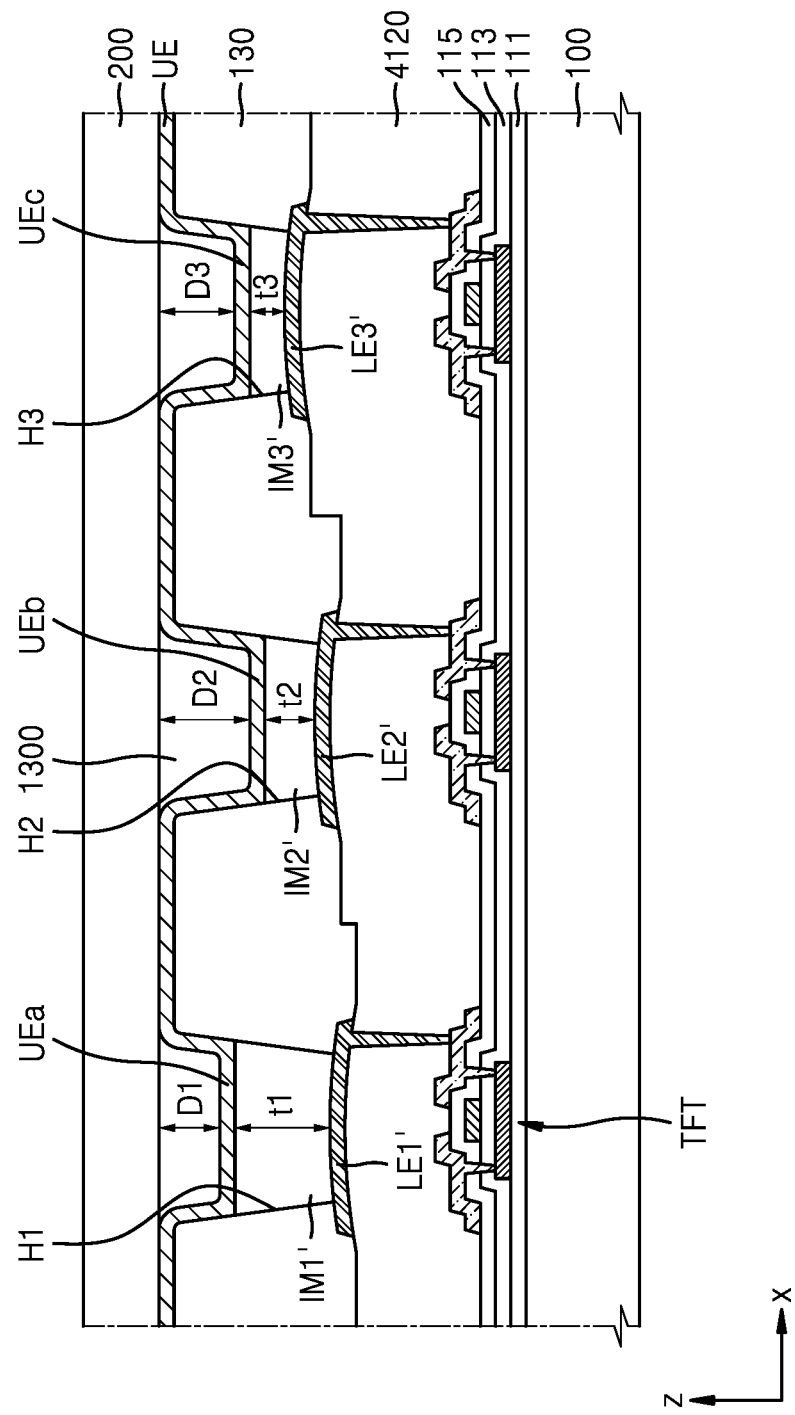
Figure 10:
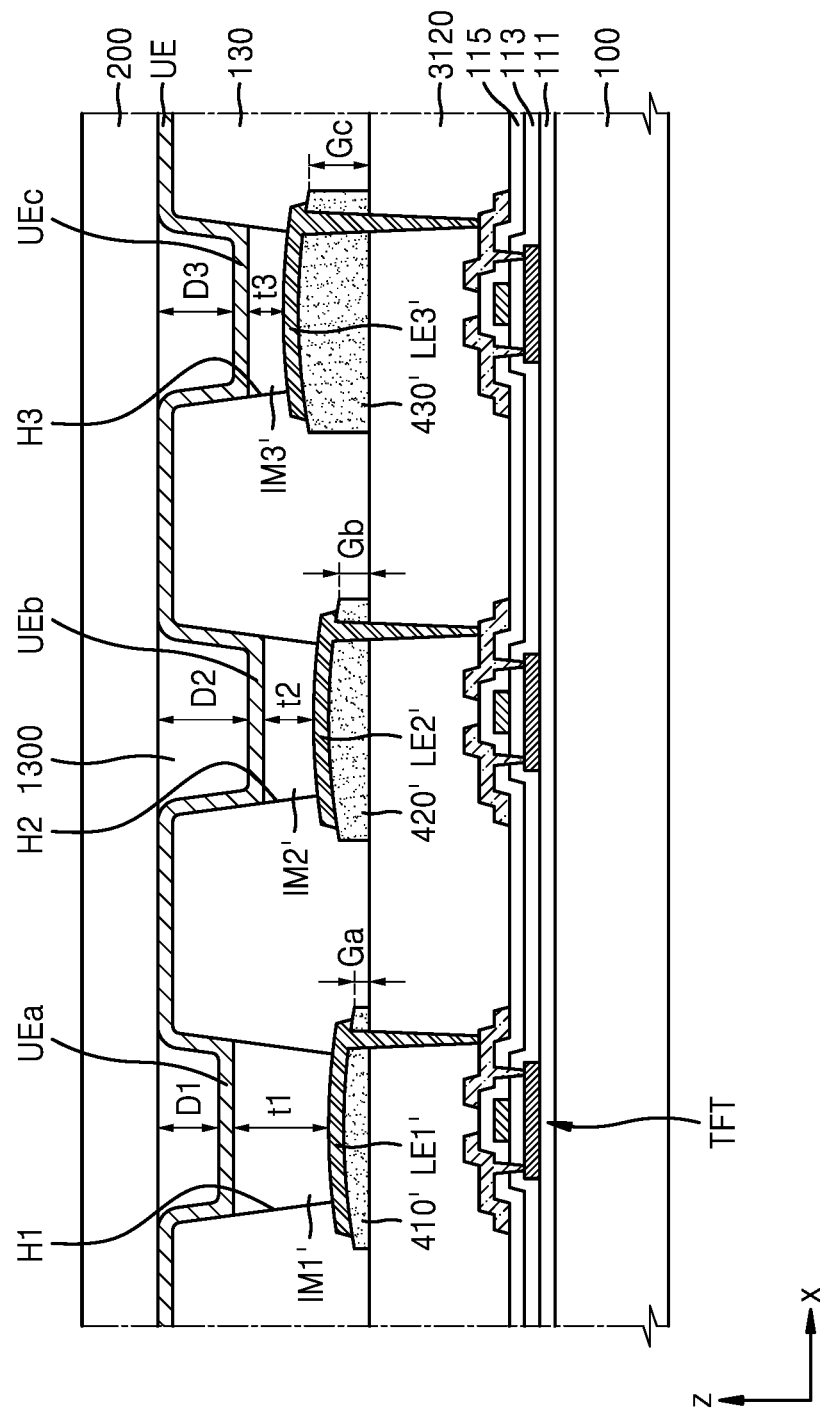

FIGS. 8 through 10 are cross-sectional views schematically illustrating a display device according to other embodiments. Regarding the display devices of FIGS. 8 through 10, the same reference numerals as those of FIG. 5 denote the same elements, and thus repeated descriptions will be omitted.

Referring to FIG. 8, the display device of FIG. 8 includes the same components as those of the display device of FIG. 5, except that an upper surface of a via-insulating layer 3120 is flat, and a first dummy insulating layer 410, a second dummy insulating layer 420, and a third dummy insulating layer 430 are arranged on the via-insulating layer 3120.

The first dummy insulating layer 410 may be arranged between the via-insulating layer 3120 and the first pixel electrode LE1, the second dummy insulating layer 420 may be arranged between the via-insulating layer 3120 and the second pixel electrode LE2, and the third dummy insulating layer 430 may be arranged between the via-insulating layer 3120 and the third pixel electrode LE3.

According to an embodiment, the first dummy insulating layer 410, the second dummy insulating layer 420, and the third dummy insulating layer 430 may have different thicknesses Ga, Gb, and Gc from each other. While all of the first through third dummy insulating layers 410, 420, and 430 are arranged in FIG. 8, the present disclosure is not limited thereto. According to another embodiment, one or two of the first through third dummy insulating layers 410, 420, and 430 may be arranged. While the thickness Ga of the first dummy insulating layer 410 is illustrated to be the thinnest and the thickness Gc of the third dummy insulating layer 430 is illustrated to be the thickest in FIG. 8, the present disclosure is not limited thereto. The thicknesses Ga, Gb, and Gc of the first through third dummy insulating layers 410, 420, and 430 may vary according to set first through third optical distances D1, D2, and D3.

The first through third dummy insulating layers 410, 420, and 430 may include an inorganic or organic insulating material, and may be formed using a material, a thickness of which is easy to adjust during a manufacturing process. Like the first through third pixel electrodes LE1, LE2, and LE3, the first through third dummy insulating layers 410, 420, and 430 may be arranged in an island shape in each sub-pixel.

Referring to FIG. 9, the other elements are the same as those of the display device of FIG. 5 except that a via-insulating layer 4120 has a dome shape under a first pixel electrode LE1, a second pixel electrode LE2', and a third pixel electrode LE3'.

The via-insulating layer 4120 may have different thicknesses under the first pixel electrode LE1, the second pixel electrode LE2', and the third pixel electrode LE3', and may have a dome shape under the first pixel electrode LE1, the second pixel electrode LE2', and the third pixel electrode LE3'. A most convex portion of the dome shape of the via-insulating layer 4120 may overlap a center portion of each of a first intermediate layer IM1', a second intermediate layer IM2', and a third intermediate layer IM3', and a dome area may be separately located in each sub-pixel and arranged in an island form.

Due to the dome shape of the via-insulating layer 4120, each of the first to third pixel electrodes LE1, LE2', and LE3' is also arranged in a dome shape having a convex center portion. The first intermediate layer IM1', the second intermediate layer IM2', and the third intermediate layer IM3' may have a greater thickness at an edge than in the center portion thereof as described above. As illustrated in FIG. 9, due to the convex shape of the first through third pixel electrodes LE1, LE2', and LE3', upper surfaces of the first intermediate layer IM1', the second intermediate layer IM2', and the third intermediate layer IM3' may be substantially flat.

According to the above-described configuration, light may be uniformly emitted throughout the entire sub-pixels, thereby improving light quality of the display device.

Referring to FIG. 10, the other elements are the same as those of the display device of FIG. 8 except that upper surfaces of a first dummy insulating layer 410', a second dummy insulating layer 420', and a third dummy insulating layer 430' have a dome shape.

By forming the upper surfaces of the first through third dummy insulating layers 410', 420', and 430' in a dome shape, each of the first through third pixel electrodes LE1, LE2', and LE3' may also have a dome shape having a convex center portion, and upper surfaces of the first intermediate layer IM1', the second intermediate layer IM2', and the third intermediate layer IM3' may be substantially flat. Here, the term "flat" means that the upper surfaces of the first intermediate layer IM1', the second intermediate layer IM2', and the third intermediate layer IM3' are flatter than the upper surfaces of the first intermediate layer IM1, the second intermediate layer IM2, and the third intermediate layer IM3 of FIGS. 5 and 8.

FIGS. 11A through 11D are cross-sectional views illustrating a method of manufacturing the display device of FIG. 5.

Figure 11A:
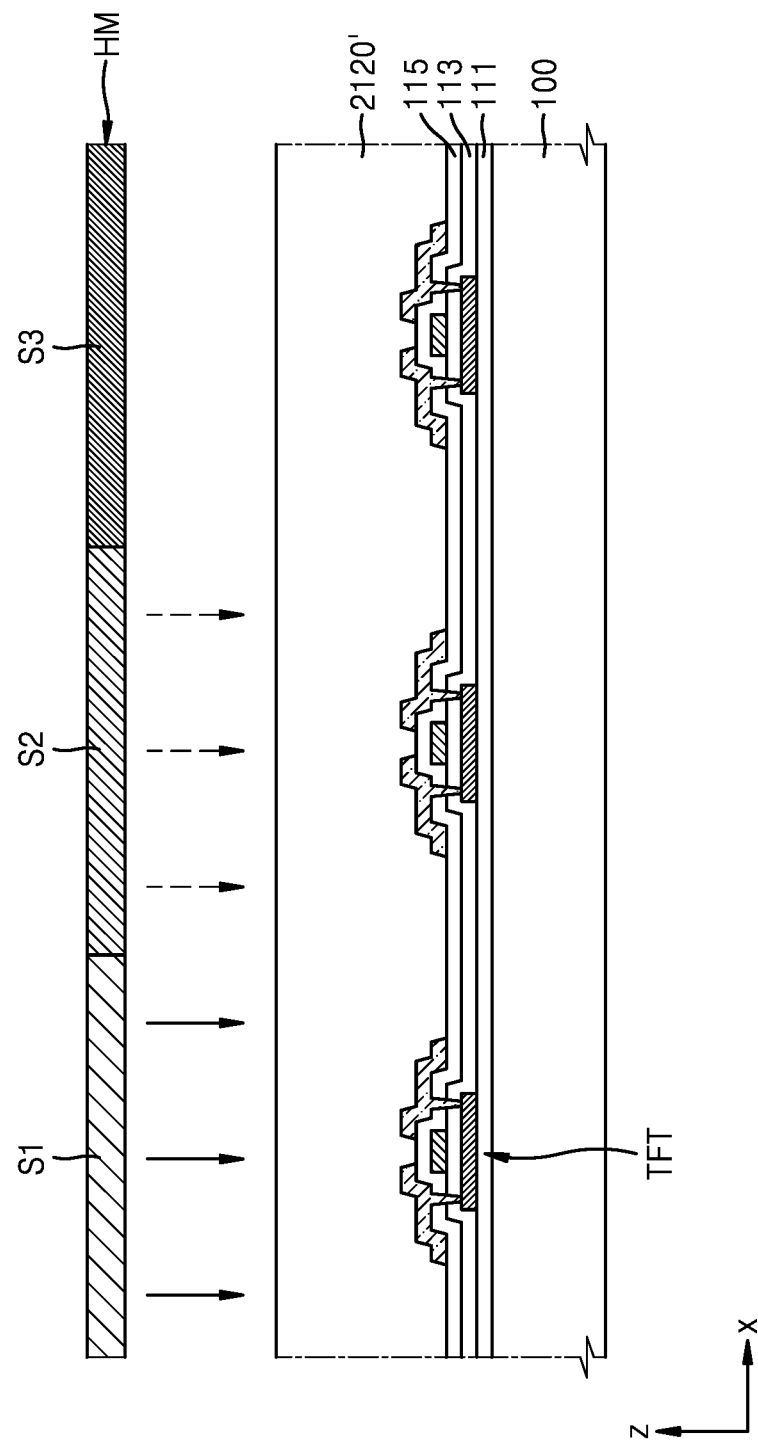
FIGS. 11A through 11D are cross-sectional views illustrating a method of manufacturing the display device of FIG. 5.

Referring to FIG. 11A, the method of manufacturing a display device according to an embodiment may include forming a pixel circuit layer PCL (see FIG. 4) including at least one thin film transistor TFT on a substrate 100 and forming a preliminary via-insulating layer 2120' on the pixel circuit layer PCL.

After arranging a halftone mask HM on the preliminary via-insulating layer 2120', light may be irradiated through the halftone mask HM. The halftone mask HM may include a first portion S1 having a highest light transmittance, a second portion S2 having a lower light transmittance than the first portion S1, and a third portion S3 blocking light. After irradiating light, a portion of the preliminary via-insulating layer 2120' may be removed through a developing process.

This method is an example in which the preliminary via-insulating layer 2120' is formed using a positive photo-sensitive material, and in another embodiment, when the preliminary via-insulating layer 2120' is not a photosensitive material, a photosensitive material may be additionally formed on the preliminary via-insulating layer 2120' and then exposure may be performed.

Figure 11B:
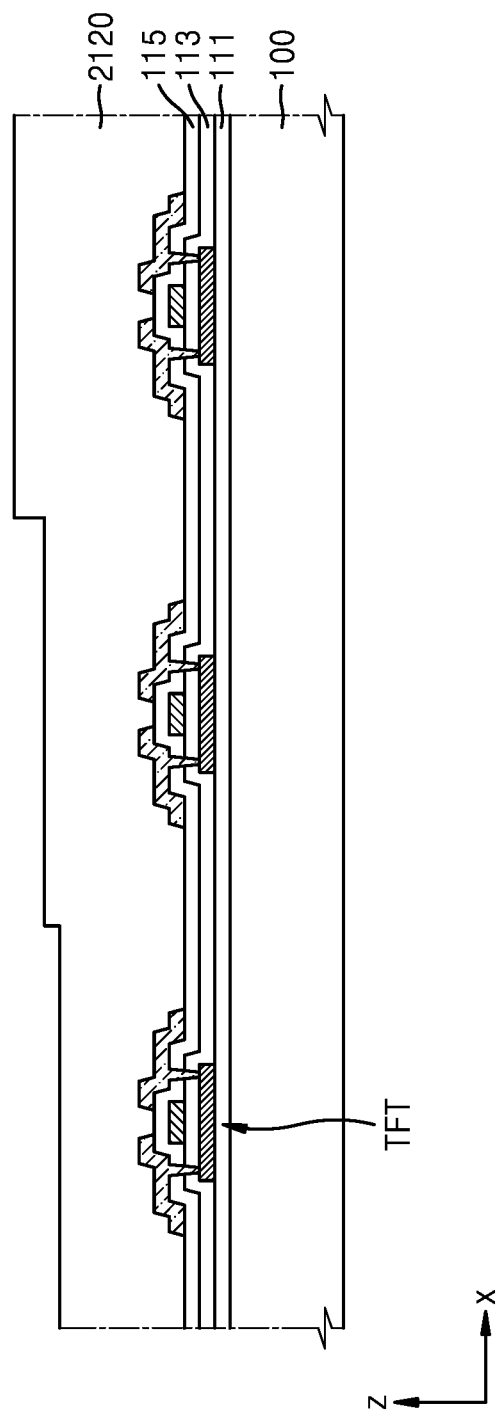

Referring to FIG. 11B, a via-insulating layer 2120 including regions having different thicknesses may be formed by exposing and developing the preliminary via-insulating layer 2120'.

Figure 11C:
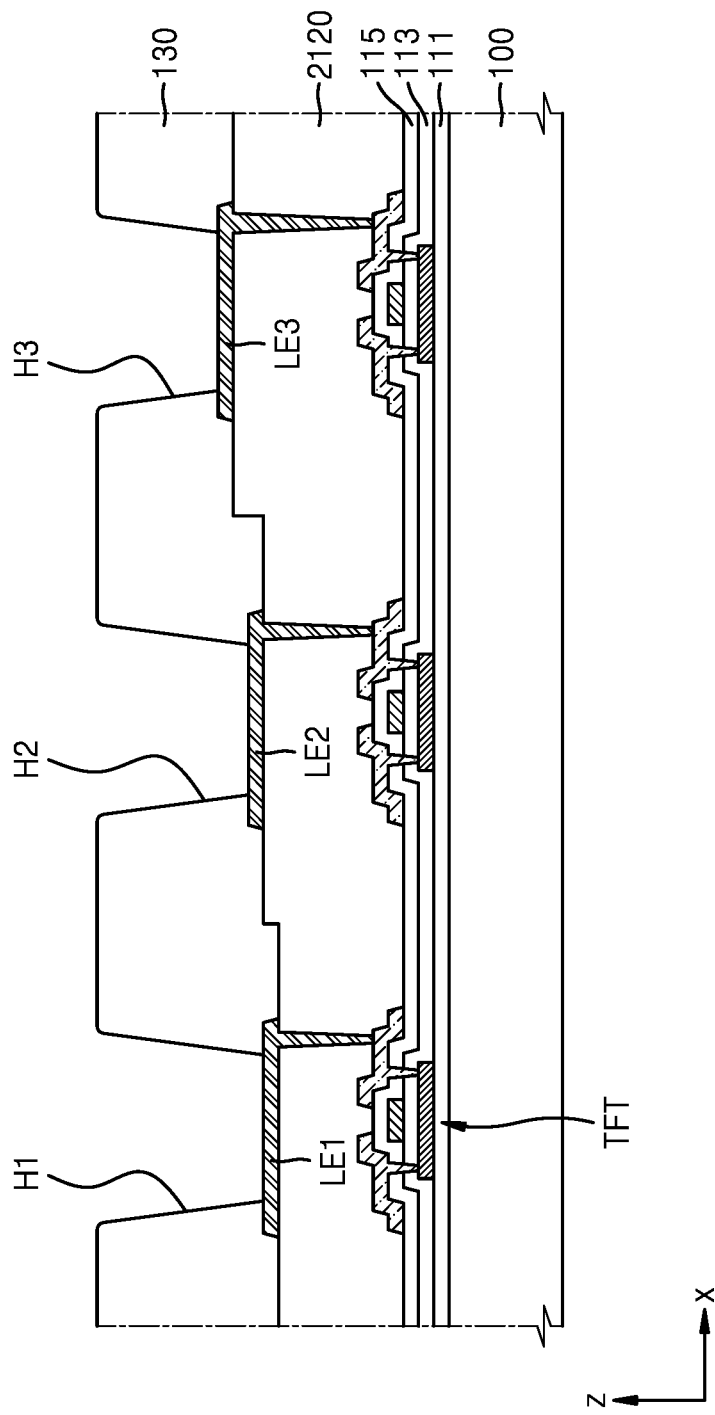

Referring to FIG. 11C, after forming a via-hole in the via-insulating layer 2120, a first pixel electrode LE1, a second pixel electrode LE2, and a third pixel electrode LE3 may be formed on the via-insulating layer 2120.

As the via-insulating layer 2120 includes the regions of different thicknesses, the first pixel electrode LE1, the second pixel electrode LE2, and the third pixel electrode LE3 may be arranged at different heights from the substrate 100.

A bank layer 130 defining a first opening H1, a second opening H2, and a third opening H3 exposing at least a portion of each of the first pixel electrode LE1, the second pixel electrode LE2, and the third pixel electrode LE3, respectively, may be formed on the via-insulating layer 2120.

Figure 11D:
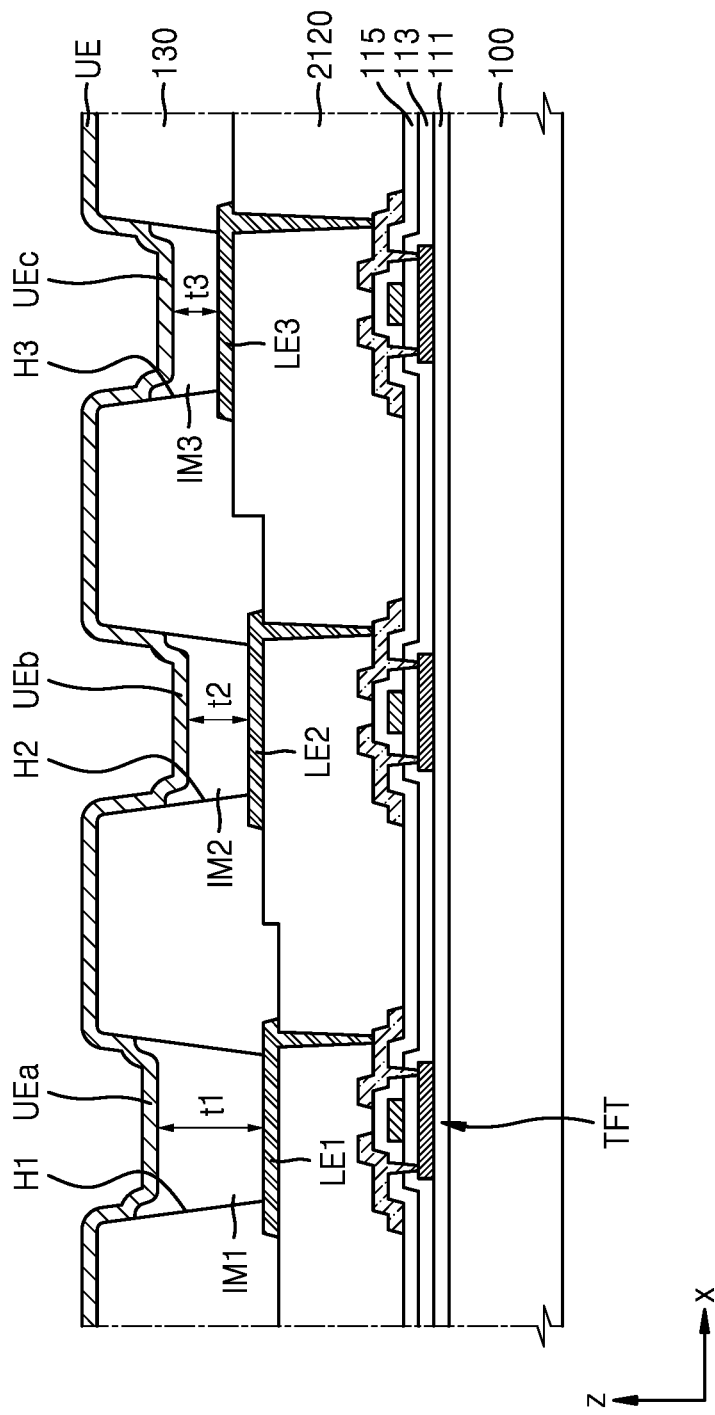

Referring to FIG. 11D, a first intermediate layer IM1 may be formed by ejecting ink including a light-emitting material that emits light of a first wavelength λ1, onto the first pixel electrode LE1 in the first opening H1. The first intermediate layer IM1 may include other functional layers in addition to the emission layer IM1c (see FIG. 4) that emits light. A second intermediate layer IM2 emitting light of a second wavelength λ2 may be formed on the second pixel electrode LE2 in the second opening H2, and a third intermediate layer IM3 emitting light of a third wavelength λ3 may be formed on the third pixel electrode LE3 in the third opening H3.

The first intermediate layer IM1, the second intermediate layer IM2, and the third intermediate layer IM3 may have different thicknesses from each other in the thickness direction (i.e., z direction), and distances between the first through third pixel electrodes LE1, LE2, and LE3 and an opposite electrode UE may be adjusted by adjusting thicknesses t1, t2, and t3 of the first through third intermediate layers IM1, IM2, and IM3, respectively.

The opposite electrode UE may be formed on the bank layer 130 and the first through third intermediate layers IM1, IM2, and IM3, and an upper substrate 200 (see FIG. 5) may be formed on the opposite electrode UE. According to an embodiment, an operation of forming a capping layer CPL (see FIG. 4) may be further performed before forming the upper substrate 200. The opposite electrode UE may include a first region UEa, a second region UEb, and a third region UEc that overlap the first intermediate layer IM1, the second intermediate layer IM2, and the third intermediate layer IM3, respectively.

Referring back to FIG. 5, the optical distances D1, D2, and D3 between the upper substrate 200 and each of the first region UEa, the second region UEb, and the third region UEc of the opposite electrode UE may satisfy the following equations.

$$D1 = A + (\lambda 1)/2 \times n1$$

$$D2 = B + (\lambda 2)/2 \times n2$$

$$D3 = C + (\lambda 3)/2 \times n3 \qquad \text{<Equations>}$$

Here, A is an optical distance between the first region UEa and the upper substrate 200 at a point where light of λ1 has a maximum intensity for a first time (in other words, A is the minimum optical distance between the first region UEa and the upper substrate 200 at a point where light of λ1 has a maximum intensity); B is an optical distance between the second region UEb and the upper substrate 200 at a point where light of λ2 has a maximum intensity for a first time (in other words, B is the minimum optical distance between the first region UEb and the upper substrate 200 at a point where light of λ2 has a maximum intensity); C is an optical distance between the third region UEc and the upper substrate 200 at a point where light of λ3 has a maximum intensity for a first time (in other words, C is the minimum optical distance between the first region UEc and the upper substrate 200 at a point where light of λ3 has a maximum intensity); n1, n2 and n3 are integers equal to or greater than 0; λ1, λ2, and λ3 denote the first wavelength, the second wavelength, and the third wavelength, respectively.

The above description has been provided above, and thus a detailed description thereof will be omitted.

Referring back to FIG. 7, after the operation of FIG. 11D, the method may further include an operation of forming the upper substrate 200 (see FIG. 7) on the opposite electrode UE and then filling a space between the opposite electrode UE and the upper substrate 200 with the filler 2300.

Referring back to FIG. 9, in the forming of the via-insulating layer 2120 of FIGS. 11A and 11B, the via-insulating layer 4120 (see FIG. 9) may be formed by forming a portion of an upper surface of the preliminary via-insulating layer 2120' in a dome shape by using an additional mask or a reflow method or the like.

Figure 12A:
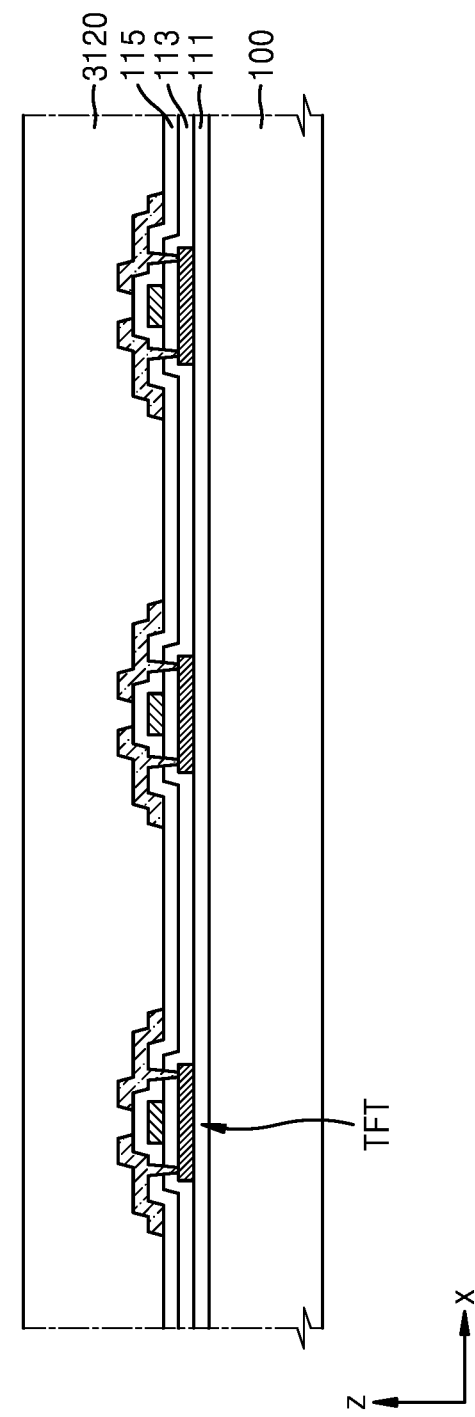
FIGS. 12A through 12C are cross-sectional views illustrating some operations of a method of manufacturing the display device of FIG. 8.
Figure 12B:
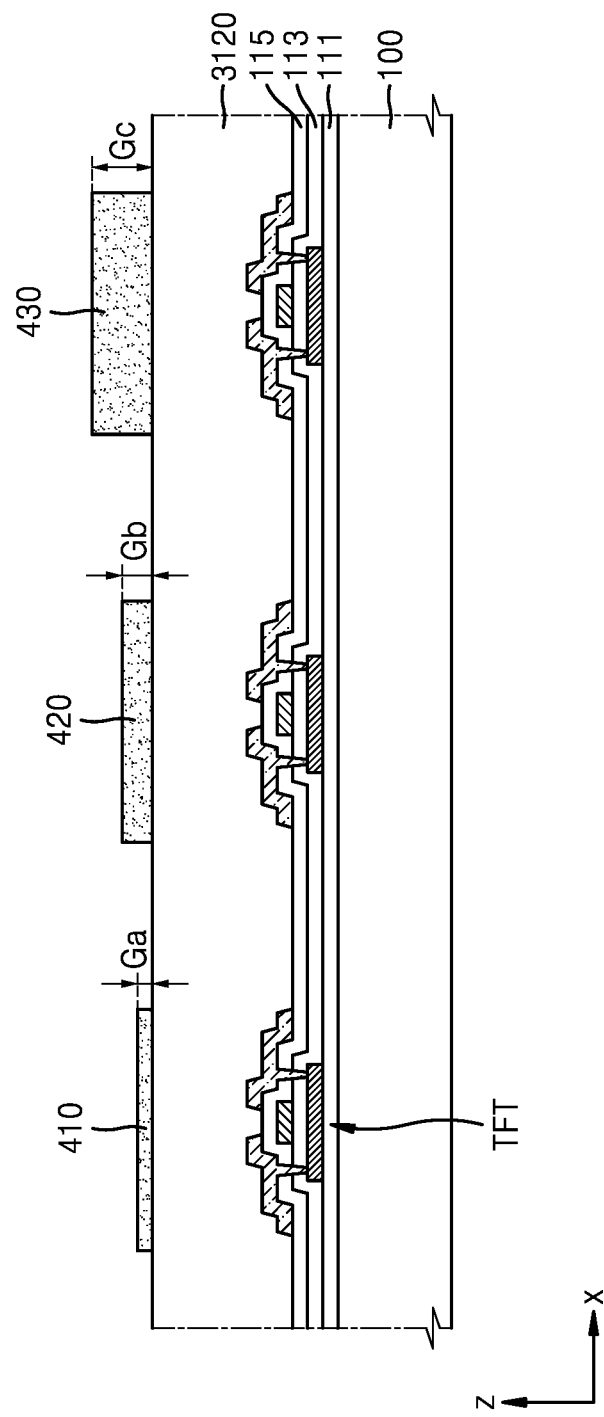
Figure 12C:
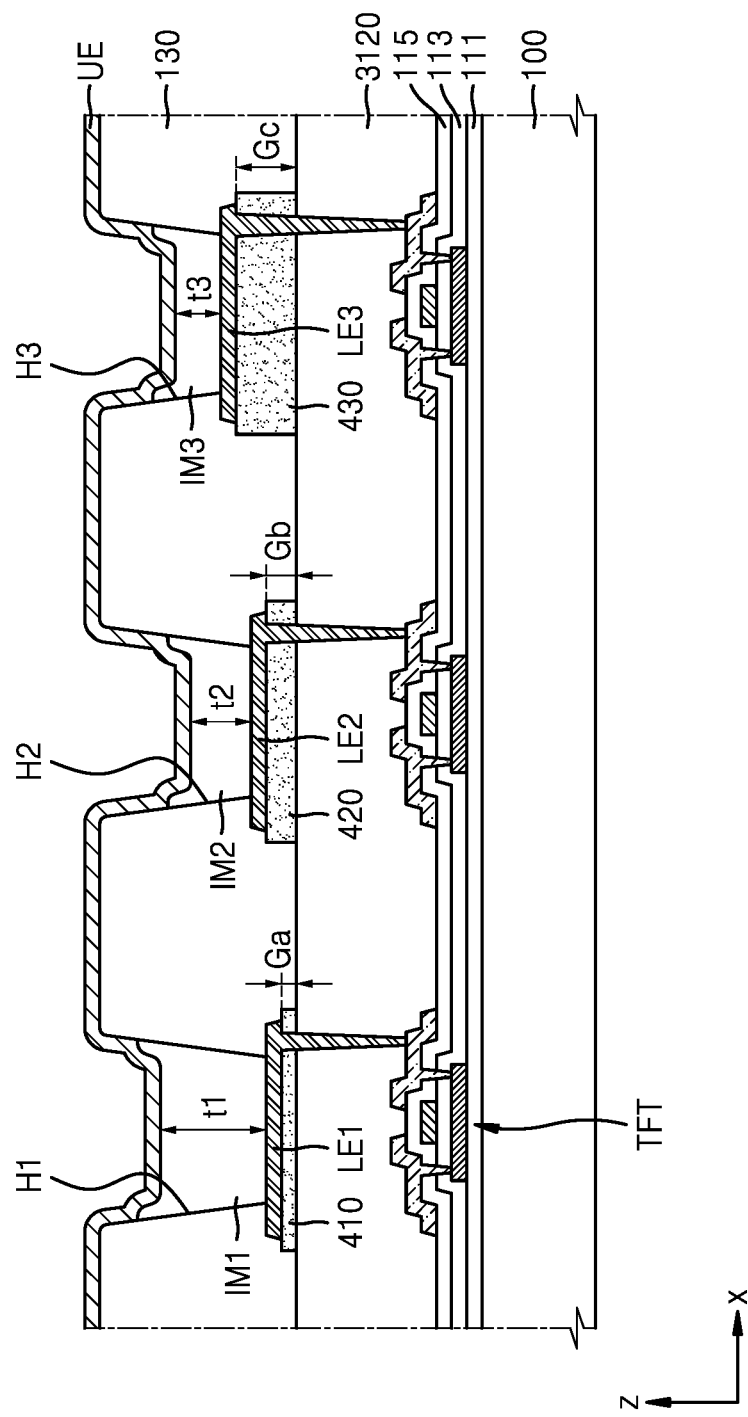

FIGS. 12A through 12C are cross-sectional views illustrating some operations of a method of manufacturing the display device of FIG. 8.

Referring to FIG. 12A, the method of manufacturing a display device according to an embodiment may include forming a pixel circuit layer PCL (see FIG. 4) including at least one thin film transistor TFT on a substrate 100 and forming a via-insulating layer 3120 on the pixel circuit layer PCL.

Referring to FIG. 12B, a first dummy insulating layer 410, a second dummy insulating layer 420, and a third dummy insulating layer 430 may be formed on the via-insulating layer 3120. The first through third dummy insulating layers 410, 420, and 430 may have different thicknesses Ga, Gb, and Gc from each other. The first through third dummy insulating layers 410, 420, and 430 may be formed in separate mask processes or in a single process using a halftone mask.

Referring to FIG. 12C, after forming the first through third dummy insulating layers 410, 420, and 430, first through third pixel electrodes LE1, LE2, and LE3, a bank layer 130, first through third intermediate layers IM1, IM2, and IM3, and an opposite electrode UE may be formed.

Referring back to FIG. 8, the upper substrate 200 may be formed on the opposite electrode UE, and a distance between the opposite electrode UE and the upper substrate 200 may be set to satisfy a resonance condition according to a wavelength. The thicknesses Ga, Gb, and Gc of the first through third dummy insulating layers 410, 420, and 430 may be determined according to the above distance.

Referring back to FIG. 10, in the forming of the first through third dummy insulating layers 410, 420, and 430 of FIG. 12B, the first through third dummy insulating layers 410', 420', and 430' of FIG. 10 may be formed by forming upper surfaces of the first through third dummy insulating layers 410, 420, and 430 in a dome shape by using a mask or a reflow method or the like.

As described above, in the display device according to embodiments, the distance between the opposite electrode UE and the upper substrate 200 may be set to satisfy a resonance condition according to a wavelength.

That is, a portion of light emitted from the organic light-emitting diode OLED between the upper substrate 200 and the opposite electrode UE may be repeatedly reflected and re-reflected, and a distance between the opposite electrode UE and the upper substrate 200 may be set to satisfy a resonance condition, thereby improving light efficiency of the display device.

According to the display device of the embodiments and the method of manufacturing the same as described above, by applying a resonance structure between an upper substrate and an opposite electrode, light extraction efficiency may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate;
a pixel circuit layer arranged on the substrate and comprising at least one thin-film transistor;
a via-insulating layer arranged on the pixel circuit layer;
a first pixel electrode arranged on the via-insulating layer;
a dummy insulating layer between the via-insulating layer and the first pixel electrode;
a bank layer arranged on the via-insulating layer and defining a first opening exposing at least a portion of the first pixel electrode;
a first intermediate layer arranged on the first pixel electrode in the first opening and which emits light including light of a first wavelength;
an opposite electrode arranged on the first intermediate layer and including a first region overlapping the first intermediate layer in a plan view; and
an upper substrate arranged on the opposite electrode,
wherein an optical distance D1 between the first region and the upper substrate satisfies an equation below:

$$D1 = A + (\lambda 1)/2 \times n,$$

where A denotes a minimum optical distance between the first region and the upper substrate at a point where light of $\lambda 1$ has a maximum intensity, n is an integer equal to or greater than 0, and $\lambda 1$ denotes the first wavelength.

2. The display device of claim 1, further comprising:
a second pixel electrode and a third pixel electrode, arranged on the via-insulating layer;
a second intermediate layer arranged on the second pixel electrode and which emits light including light of a second wavelength; and a third insulating intermediate layer arranged on the third pixel electrode and which emits light including light of a third wavelength,
wherein the bank layer defines a second opening and a third opening exposing a portion of the second pixel electrode and a portion of the third pixel electrode, respectively, and
the opposite electrode includes a second region and a third region overlapping the second intermediate layer and the third intermediate layer, respectively, in the plan view.

3. The display device of claim 2,
wherein a first dummy insulating layer, a second dummy insulating layer, and a third dummy insulating layer are arranged between the via-insulating layer and each of the first pixel electrode, the second pixel electrode, and the third pixel electrode, respectively, and
wherein the first dummy insulating layer, the second dummy insulating layer, and the third dummy insulating layer have different thicknesses from each other.

4. The display device of claim 1, wherein an upper surface of the dummy insulating layer has a dome shape.

5. The display device of claim 2, wherein an optical distance D2 between the second region and the upper substrate and an optical distance D3 between the third region and the upper substrate in a thickness direction satisfy equations below, respectively:

$$D2 = B + (\lambda 2)/2 \times n2$$

$$D3 = C + (\lambda 3)/2 \times n3,$$

where B is a minimum optical distance between the second region and the upper substrate at a point where light of $\lambda 2$ has a maximum intensity, C is a minimum optical distance between the third region and the upper substrate at a point where light of $\lambda 3$ has a maximum intensity, n2 and n3 are integers equal to or greater than 0, and $\lambda 2$ and $\lambda 3$ denote the second wavelength and the third wavelength, respectively.

6. The display device of claim 2, wherein the first intermediate layer, the second intermediate layer, and the third intermediate layer have different thicknesses from each other.

7. The display device of claim 2, wherein the dummy insulating layer is disposed between the via-insulating layer and at least one of the first pixel electrode, the second pixel electrode, and the third pixel electrode.

8. The display device of claim 1, further comprising a capping layer between the opposite electrode and the upper substrate.

9. The display device of claim 1, wherein air is filled in a space between the opposite electrode and the upper substrate.

10. The display device of claim 1, wherein the dummy insulating layer has a constant thickness.

* * * * *